United States Patent [19]

Brown, Jr. et al.

[11] 4,320,351
[45] Mar. 16, 1982

[54] DIFFERENTIAL AMPLIFYING SYSTEM WITH BOOTSTRAPPING

[75] Inventors: Floyd A. Brown, Jr., Palo Alto; Dilip G. Saraf, Atherton, both of Calif.

[73] Assignee: SRI International, Menlo Park, Calif.

[21] Appl. No.: 124,551

[22] Filed: Feb. 25, 1980

[51] Int. Cl.³ .......................... H03F 1/34; H03F 3/45
[52] U.S. Cl. ................................ 330/260; 330/291; 330/69
[58] Field of Search ............... 330/69, 112, 156, 260, 330/291, 258

[56] References Cited

U.S. PATENT DOCUMENTS 3,643,173  2/1972  Whitten ............................. 330/260
4,047,122  9/1977  Rao .................................... 330/69

OTHER PUBLICATIONS

Larry L. Schick "Linear circuit applications of operational amplifiers" IEEE Spectrum, Apr. 1971, pp. 45–46.
Allan G. Lloyd "Voltage follower has high impedance can handle large signals" Electronic Design 19, Sep. 13, 1967, p. 124.
G.B. Clayton, Operational Amplifiers' Applications, Wireless World, Apr. 1969, pp. 154–156.

Primary Examiner—James B. Mullins
Assistant Examiner—Gene Wan
Attorney, Agent, or Firm—Urban H. Faubion

[57] ABSTRACT

A differential amplifying system is disclosed which includes a first section having a pair of amplifying channels comprising a pair of operational amplifiers having low noise characteristics, each of which amplifiers has an inverting input, a noninverting input, and an output terminal. Input capacitors are provided for differentially connecting an input signal to be amplified to the noninverting inputs of said pair of amplifiers. Balanced negative feedback resistance circuits are provided for connecting the output terminals of the amplifiers to their own inverting inputs. The noninverting amplifier inputs are connected to ground through a balanced pair of tapped resistance networks. Balanced positive feedback circuits, each including a resistor, connect the amplifier output terminals to the taps on the associated resistance networks for positive feedback to said noninverting amplifier inputs thereby increasing the effective input resistance of said amplifying channels. The output terminals of said pair of amplifiers are resistance coupled to the inverting and noninverting inputs of a third operational amplifier having an output proportional to the difference of the two input signals supplied thereto from said pair of amplifiers. A fourth operational amplifier capacitance coupled to the output signal from the third operational amplifier provides the system with the desired voltage gain.

3 Claims, 2 Drawing Figures

DIFFERENTIAL AMPLIFYING SYSTEM WITH BOOTSTRAPPING

ORIGIN OF THE INVENTION

The Government has rights in this invention pursuant to Contract No. NOI-NS-3-2322.

BACKGROUND OF THE INVENTION

Preamplifiers, and preamplifier systems, having differential input circuits for a high common mode rejection characteristic, are well known, of course. Such differential amplifiers often are used for signal conditioning of low level signals supplied by transducers in biomedical and other such applications. A typical amplifier system of this type is disclosed in an article entitled "A Low-Cost High-Gain Amplifier with Exceptional Noise Performance," by L. L. Huntsman and G. L. Nichols, in IEEE Transactions on BIO-MEDICAL ENGINEERING, July 1971, pages 301 and 302. However, where capacitor coupling is used for coupling the input signal to the differential inputs of the system for d-c isolation of the system from the transducer, a direct current path to ground must be provided for supplying charging currents to the coupling capacitors, as well as bias currents to the amplifier inputs. Conventionally, a resistor or resistor network is included for connection of the amplifier inputs to ground. However, such resistor networks lower the amplifier input impedance thereby loading the low level input signal to be amplified. If large value resistor networks are used in an effort to reduce signal loading, an excessive input offset voltage is produced due to the amplifier bias currents flowing therethrough.

SUMMARY OF THE INVENTION AND OBJECTS

It is a general object of this invention to provide a differential amplifier system which overcomes the above mentioned shortcomings and difficulties of prior art differential amplifier systems at a low cost.

It is another general object of this invention to provide an improved differential amplifier system for low level input signals having a high common mode rejection ratio, a high differential voltage gain, high input impedance, minimum output-offset voltage, and excellent frequency response down to extremely low frequencies, approaching direct current.

The above and other objects and advantages are achieved by use of a differential amplifier system which includes a first section, or stage, comprising a pair of amplifying channels, each of which channels includes an operational amplifier having low noise characteristics. Each amplifier has an inverting and noninverting input and an output terminal. A low level input signal to be amplified is differentially connected to the noninverting inputs of the amplifiers through a pair of input coupling capacitors. Balanced negative feedback resistance means connect the output terminals of the amplifiers to their own inverting inputs. Also, balanced input resistor networks connect the noninverting inputs to ground for supply of charging currents to the input coupling capacitors and bias currents to the noninverting inputs. In accordance with the present invention balanced positive feedback means, each including a resistor, connect the amplifier output terminals to taps on the associated input resistor networks for positive feedback to said noninverting amplifier inputs thereby greatly increasing the effective input impedance of the amplifying channels. Preferably, the balanced positive feedback means also include blocking capacitors in series circuit with said feedback resistors to prevent positive feedback of the amplifier offset voltages, thereby obviating latchup problems. The output terminals of said amplifiers are resistance coupled to the inverting and noninverting inputs of a third operational amplifier having an output proportional to the difference of the two input signals supplied thereto from the pair of amplifying channels. The third operation amplifier serves, primarily, for conversion of the differential input signal to a single-ended output signal, with little or substantially no voltage gain, to provide common mode rejection. The output from the third operational amplifier is capacitor coupled, for desired low frequency bandwidth response, to a fourth operational amplifier for amplification thereof.

The nature of the present invention will be more fully apparent and understood from a consideration of the following description in light of the drawings.

Figure 1:
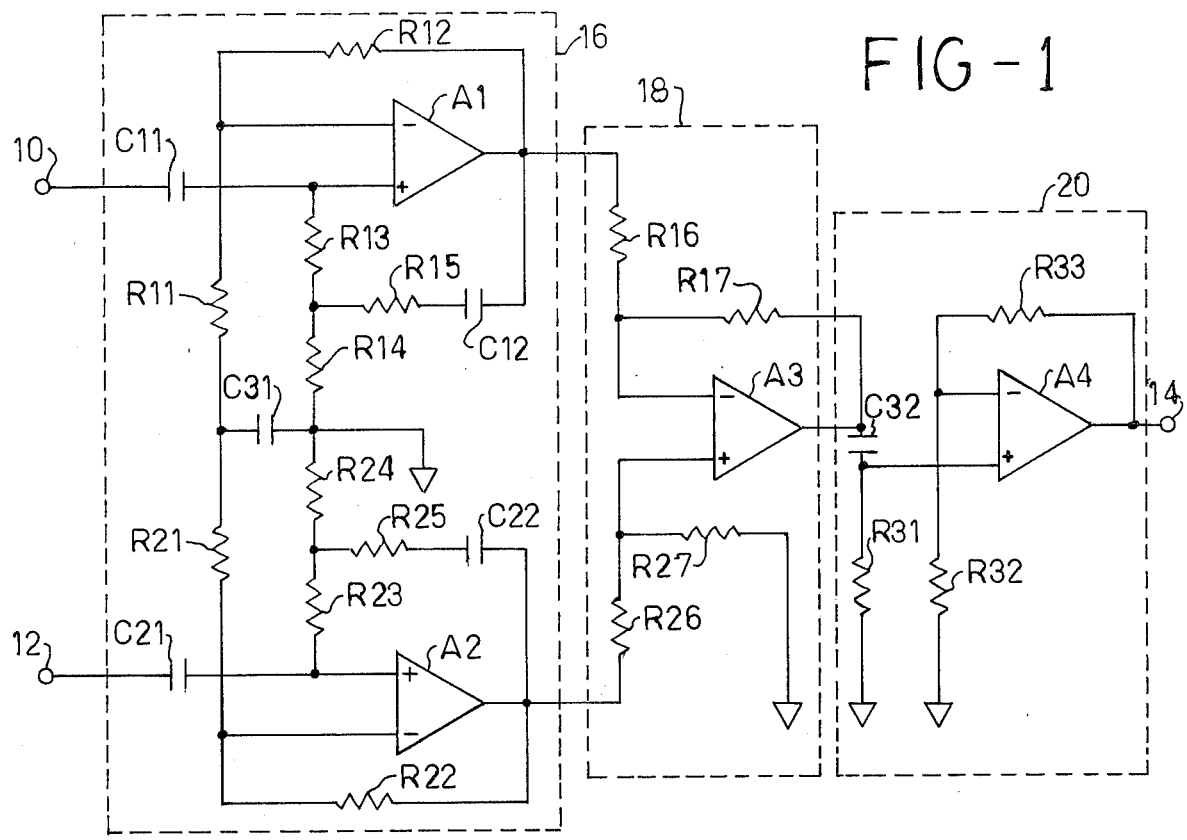
FIG. 1 is a schematic circuit diagram of a differential amplifying system embodying the present invention.

Reference first is made to FIG. 1 wherein the amplifier system of this invention is shown comprising first and second differential input signal terminals 10 and 12, respectively, and single output terminal 14. The illustrated system includes three sections, or stages 16, 18 and 20, the first of which is of the differential input with differential output amplifier type, followed by differential input with single-ended output stage 18 which, in turn, is followed by single-ended input with single-ended output stage 20.

The input stage 16 of the amplifier system includes parallel operating channels comprising operational amplifiers A1 and A2 having low noise and relatively high gain characteristics, and the other stages 18 and 20 include single operational amplifiers A3 and A4. The operational amplifiers may all be of the same type and in an amplifying system which has been built and tested, type op-10 operational amplifiers manufactured by Precision Monolithic Inc. have been employed. Obviously, the system is not limited to use of these particular operational amplifiers. Also, the circuit of this invention is well adapted for construction using hybrid thick film technology. As seen, the operational amplifiers each include a noninverting input (+), an inverting input (−), and an output terminal. Other terminals for connection to external biasing supplies and frequency compensating components are omitted for simplicity of illustration.

The low level ac input signal to be amplified, such as electrocardiograph (ECG) or electroencephalograph (EEG) signals from biomedical transducers, is differentially connected to the noninverting inputs of the amplifies A1 and A2 through coupling capacitors C11 and C21 which provide d-c isolation of the amplifier system from the transducer for patient protection. Balanced input resistor networks comprising series-connected resistors R13 and R14 and series-connected resistors R23 and R24 connect the noninverting inputs of amplifiers A1 and A2, respectively, to a common ground terminal. These resistor networks provide charging current paths for the input coupling capacitors C11 and C21, and bias current paths for the noninverting inputs. Balanced negative feedback resistors R12 and R22 connect the output terminals of the amplifiers A1 and A2 to their own inverting input terminals for reduction of amplifier gain. The inverting input terminals also are connected together through balance resistors R11 and R12, and the junction point betweeen the resistors is bypassed to the common ground terminal through a small capacitor C31 to prevent high frequency oscillations of the stage. The size of the capacitor C31 is chosen so as to avoid compromising frequency response. In practice a capacitor on the order of say, 1 μf may be used.

As noted above, the resistor networks R13, R14 and R23, R24 are required to provide charging current paths for the coupling capacitors C11 and C21, and biasing current paths for the noninverting inputs of amplifiers A1 and A2. However, such resistor networks reduce the input resistance of the amplifying channels to degrade performance thereof. If high value resistance networks are employed in an effort to maintain the high input resistance characteristics thereof, excessive input offset voltage results due to the amplifier bias currents flowing therethrough. In accordance with the present invention bootstrapping is provided to restore current taken from the low level input source thereby effectively increasing the amplifier input resistance. With the illustrated arrangement positive, or regenerative, feedback is provided by balanced positive feedback networks comprising series-connected RC circuits R15, C12 and R25, C22 connecting the output terminals of the amplifiers A1 and A2 to the taps, or junctions, between input resistors R13 and R14, and R23 and R24, in the noninverting input circuits of the associated amplifiers. The capacitors C12 and C22 prevent positive feedback of the amplifier output offset voltages thereby preventing latchup of the amplifiers. The illustrated positive feedback effectively increases the resistances of resistors R13 and R23 by the amount of the bootstrap gain. For amplifier A1, the bootstrap gain is:

$$\text{Bootstrap Gain} = \frac{1}{1 - \left[\left(1 + \frac{R12}{R11}\right) \times \left(\frac{R14}{R14 + R15}\right)\right]} \quad (1)$$

With the illustrated balanced circuit arrangement for input stage 16, amplifier A2 in the other channel has the same bootstrap gain. From equation (1), it will be seen that bootstrap gain is a measure of the ratio of negaive feedback gain to positive feedback gain. For maximum input impedance, a bootstrap gain of unity would be desired. In practice, using properly selected component values, bootstrap gains of as low as, approximately, 20 may be employed wthout oscillation, or instability, of the amplifier stage. For example, with input resistors R13 and R23 of 22 M-ohm value, and with a bootstrap gain of 20, an effective input resistance in excess of 400 M-ohm is possible. In addition to having a high input resistance, the balanced input and output arrangement provides the system with a high common-mode rejection ratio (CMRR).

The amplified differential output from the first stage 16 is supplied to the second stage 18 which comprises a subtractor, of difference, amplifier. One input signal, from the amplifier A1, is supplied to the inverting input of the amplifier A3 through an input resistor R16. The amplifier output terminal is connected through a feedback resistor R17 to said inverting input for negative feedback. The other input signal, from the amplifier A2, is supplied to an input voltage divider, resistors R26, and R27, the other end of which is connected to the common ground terminal, and the junction between which resistors is connected to the non-inverting input of the amplifier A3. The values of all the resistors R16, R17, R26, and R27 are the same whereby the output is equal to the input voltage at the noninverting input less the voltage at the inverting input. This stage which is of conventional design, serves to convert the balanced double-ended output from the first stage to a single-ended output which is proportional thereto, to provide the common mode rejection. Where hybrid thick film technology is used in the amplifier manufacture, resistor R27 may include a trimmer resistor adjustable for further enhancement of the common mode rejection ratio characteristic.

The single-ended output terminal from amplifier A3 is capacitance coupled through capacitor C32 to the noninverting input of amplifier A4 at the third stage 20. An input resistor R31 is connected between the noninverting input and the common ground terminal for the supply of charging current to the coupling capacitor C32 and biasing current to the noninverting input terminal. The RC time constant of capacitor C32 and resistor R31 for coupling the second and thrid stages is selected to provide the system with the desired low frequency response, i.e. for bandwidth control at the low frequency end thereof. A feedback resistor R33 connects the amplifier output terminal to the inverting input thereof, and resistor R32 connects the inverting input to the common ground terminal. A relatively low resistance value is selected for resistor R31 to reduce offset voltage output. Resistors R32 and R33 in the feedback and inverting input circuit of amplifier A4 establish, essentially, the gain of the stage, and are selected to provide the required voltage gain.

Without limiting the invention, the following table lists component values for the illustrated embodiment which we have found to be particularly well suited to provide the preamplifier system with a high CMRR, high differential voltage gain, high input impedance and low output impedance, minimum output offset voltage and excellent frequency response, optimized for EEG use; appropriate modification of RC time constants C12, R15 and C22, R25 and C32, R31 will optimize the device for ECG use.

| Resistors | Ohms |
|---|---|
| R12, R22 | 10K* |
| R11, R21 | 909 |
| R13, R23 | 22M |
| R14, R24 | 82.5K |
| R15, R25 | 1M* |
| R16, R26 | 10K* |
| R17, R27 | 10K* |
| R31 | 162K |
| R32 | 909 |
| R33 | 192K |
| Capacitors | μfd. |
| C11, C21 | 1 |
| C12, C22 | 10 |
| C31 | 1 |

| -continued | |
|---|---|
| C32 | 1 |

*These resistors are matched to 0.1% for balanced input impedance and high CMRR.

Figure 2:
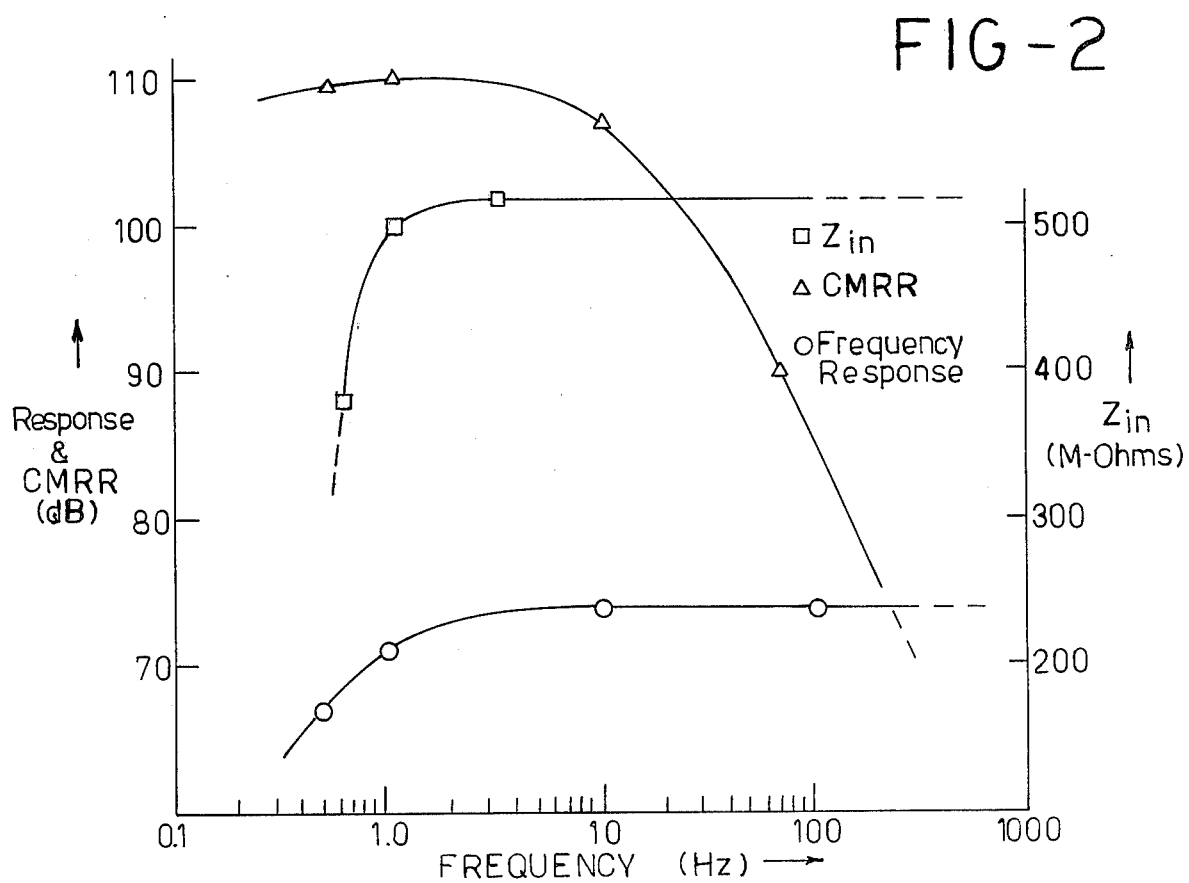
FIG. 2 is a graph showing performance characteristics of the amplifier system.

Operating characteristics for a system optimized for EEG use embodying the present invention are shown in FIG. 2. The flat frequency response, high input impedance, and high CMRR are illustrated in FIG. 2 for the frequency range of between, approximately 2 to 100 Hz. As is understood, response to lower frequencies is not desired for EEG use, but may be obtained, as noted above, by modification of the RC time constant of R31, C32 for coupling of lower frequency signals between stages 18 and 20.

The invention having been described in detail in accordance with requirements of the U.S. Patent Statutes, various changes and modifications will suggest themselves to those skilled in this art, which changes and modifications are intended to fall within the spirit and scope of the invention defined in the appended claims.

We claim:

1. In a bootstrapped balanced differential amplifier system having a high common mode rejection ratio and input impedance for amplification of low level differential mode ac signals, the combination comprising, first and second operational amplifiers of the same type and each having inverting and noninverting inputs and an output, first and second input coupling capacitors for differentially connecting a signal to be amplified to the noninverting inputs of said first and second operational amplifiers, first and second balanced negative feedback means comprising first and second resistors, respectively, for degenerative feedback from the output of each of said amplifiers to its own inverting input, first and second balanced voltage divider networks connecting said noninverting inputs to ground for the supply of charging currents to said first and second input coupling capacitors and input bias currents to said inverting inputs, of said first and second amplifiers, respectively, first and second balanced positive feedback means connecting the outputs of the first and second amplifiers to taps on said first and second balanced voltage divider networks, respectively, for regenerative feedback from the output of each of said amplifiers to its own noninverting input, said first and second balanced positive feedback means comprising only passive circuit elements, each said positive feedback means comprising series connected resistor-capacitor means for limiting regenerative feedback gain for stable amplifier operation and for preventing regenerative feedback of amplifier offset voltage to avoid latchup, a third operational amplifier having inverting and noninverting inputs and an output, and means for connecting the outputs of said first and second amplifiers to the respective inverting and noninverting inputs of said third amplifier whereby the output from said third amplifier comprises the voltage difference of the first and second amplifier outputs.

2. In a bootstrapped balanced differential amplifier system as defined in claim 1 wherein, said first and second operational amplifiers have a bootstrap gain on the order of approximately at least 20 for stability.

3. In a bootstrapped balanced differential amplifier system as defined in claim 1 including, a fourth operational amplifier having inverting and noninverting inputs and an output, resistor-capacitor coupling means for coupling the output from the third amplifier to the noninverting input of the fourth amplifier to the noninverting input of the fourth amplifier, the RC time constant of which coupling means is selected for system bandwidth control at the low frequency end thereof, and resistor means connecting the output of the fourth amplifier to its own inverting input for degenerative feedback.

* * * * *